US007161283B1

United States Patent
Geefay

(10) Patent No.: US 7,161,283 B1
(45) Date of Patent: Jan. 9, 2007

(54) METHOD FOR PLACING METAL CONTACTS UNDERNEATH FBAR RESONATORS

(75) Inventor: Frank S. Geefay, Cupertino, CA (US)

(73) Assignee: Avago Technologies Wireless IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/174,364

(22) Filed: Jun. 30, 2005

(51) Int. Cl.
*H01L 41/047* (2006.01)
*H01L 41/053* (2006.01)
(52) U.S. Cl. ...................................... 310/348; 310/365
(58) Field of Classification Search ................ 310/348, 310/365, 366
See application file for complete search history.

(56) References Cited

U.S. PATENT DOCUMENTS

| 6,777,263 | B1 | 8/2004 | Gan et al. |
| 6,818,464 | B1 | 11/2004 | Heschel |
| 6,836,013 | B1 | 12/2004 | Geefay |
| 6,903,012 | B1 | 6/2005 | Geefay et al. |
| 2005/0218488 | A1 * | 10/2005 | Matsuo ....................... 257/678 |

\* cited by examiner

*Primary Examiner*—Darren Schuberg
*Assistant Examiner*—Derek Rosenau

(57) ABSTRACT

A device includes a device substrate defining a pit in a topside of the device substrate, a film bulk-wave acoustic resonator (FBAR) mounted over the pit on the device substrate, a first contact pad on a backside of the device substrate that is coupled to a bottom electrode of the FBAR, and a second contact pad on the backside of the device substrate that is coupled to a top electrode of the FBAR.

20 Claims, 6 Drawing Sheets

METHOD FOR PLACING METAL CONTACTS UNDERNEATH FBAR RESONATORS

DESCRIPTION OF RELATED ART

A thin film semiconductor process is used to create a film bulk-wave acoustic resonator (FBAR), which consists of an electrode-piezoelectric-electrode sandwich suspended in air. When an alternating electrical potential is applied across the electrode-piezoelectric-electrode sandwich, the entire piezoelectric layer expands and contracts, creating a vibration. This resonance is in the body (bulk) of the material, as opposed to being confined to the surface as in the case for Surface Acoustic Wave (SAW) devices. Such an acoustic resonator may act as a filter in the duplexers for cellular handsets.

To build a FBAR device, a pit is formed on a substrate and then filled with a sacrificial material. A stack consisting of a bottom electrode, a piezoelectric, and a top electrode is formed over the filled pit. A passivation layer is then formed above the stack. The top electrode and the piezoelectric are patterned, and the sacrificial material is removed to suspend the stack over the pit to form the FBAR device.

SUMMARY

In one embodiment of the invention, a device includes a device substrate defining a pit in a topside of the device substrate, a film bulk-wave acoustic resonator (FBAR) mounted over the pit on the device substrate, a first contact pad on a backside of the device substrate that is coupled to a bottom electrode of the FBAR, and a second contact pad on the backside of the device substrate that is coupled to a top electrode of the FBAR.

BRIEF DESCRIPTION OF THE DRAWINGS

Use of the same reference numbers in different figures indicates similar or identical elements.

DETAILED DESCRIPTION

U.S. Pat. No. 6,777,263 describes a device package where a seal ring structure is formed around a via that passes through the cap wafer and down to the device wafer. A via contact is formed in the via to contact a via pad on the device wafer. The seal ring structure incorporates a treaded surface coated with a metal to hermetically seal the via where it makes contact with the pad on the device wafer. The seal may break if the seal ring structure is not properly bonded. In addition, the seal ring structure is relatively large in size and therefore requires a large via pad on the device wafer. For example, the areas consumed by the via pads can be as much as 50% of the device area for a small device around 0.5 millimeter square. This size of the via pad reduces the number of devices that can be manufactured per wafer. Thus, an alternative is provided for providing an electrical connection to the device within the device package.

Figure 1A:
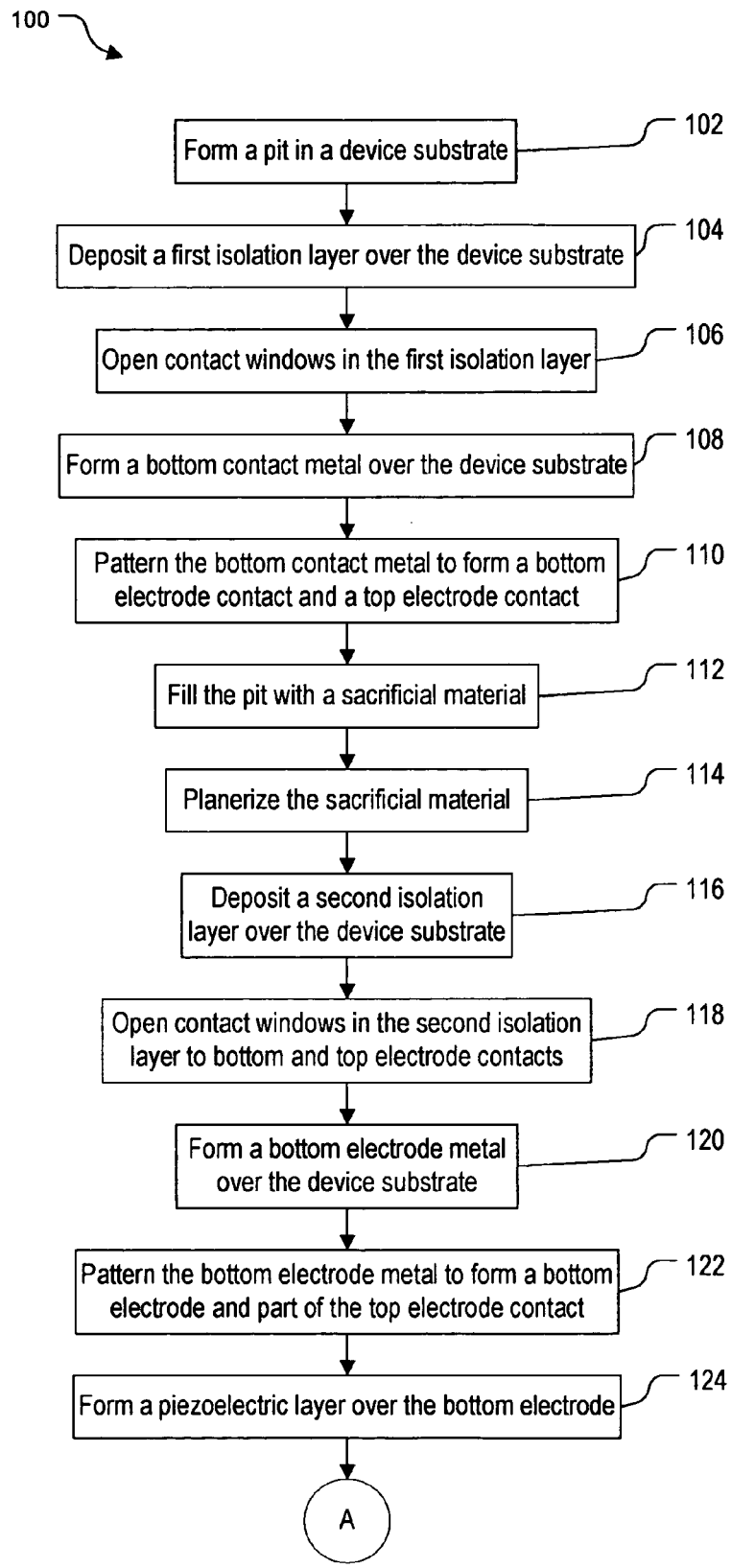
FIGS. 1A and 1B are a flowchart of a method to fabricate a film bulk-wave acoustic resonator (FBAR) device having metal contacts underneath the FBAR in one embodiment of the invention.
Figure 1B:
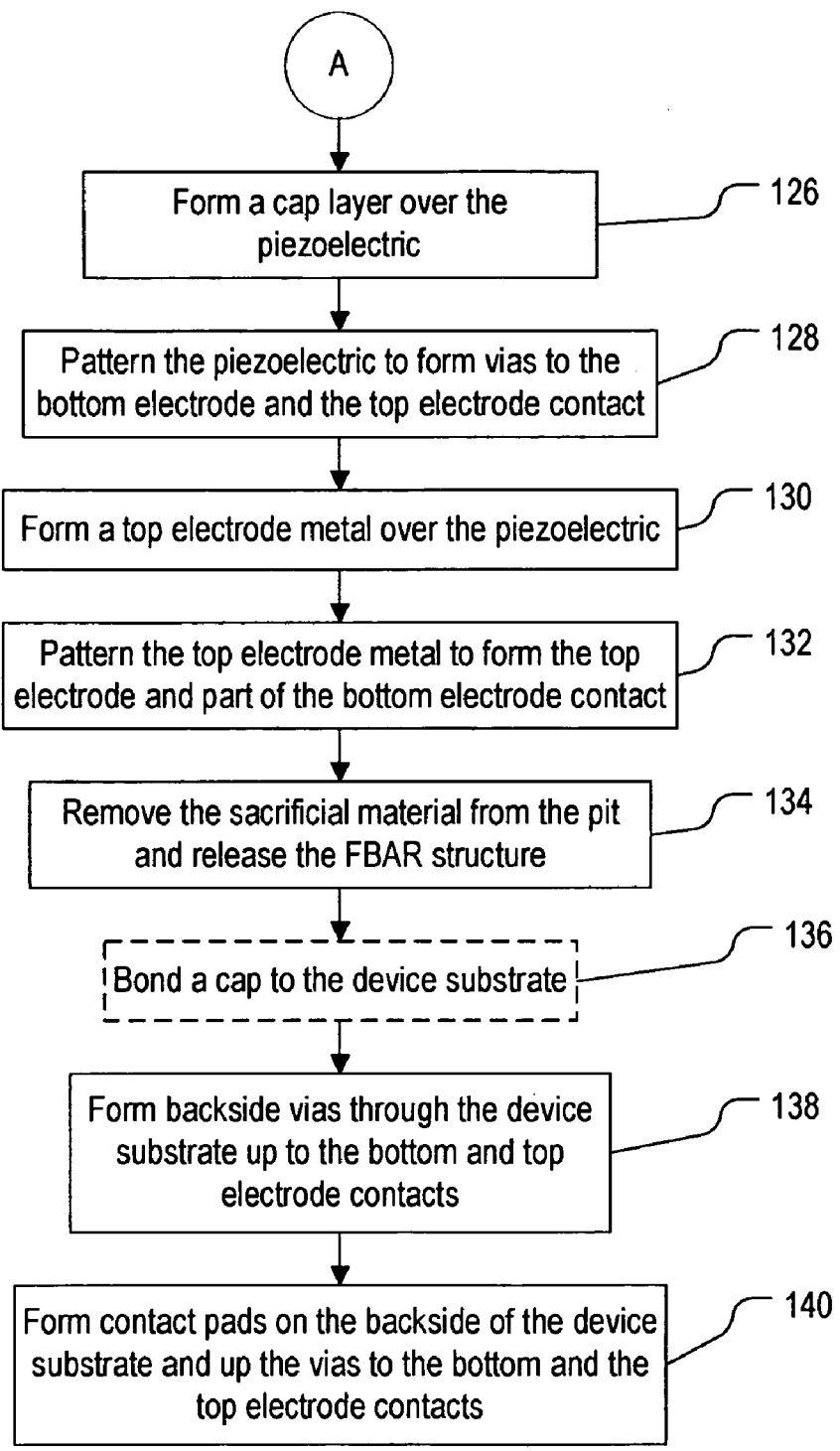

FIGS. 1A and 1B illustrate a method 100 to fabricate a film bulk-wave acoustic resonator (FBAR) device 2000 (FIG. 20) having metal contacts underneath the FBAR in one embodiment of the invention. FIGS. 2 to 20 illustrate the cross-sections of device 2000 fabricated using method 100.

Figure 2:
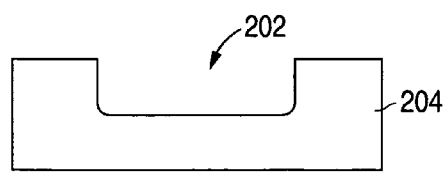
FIGS. 2 to 20 illustrate cross-sections of a device fabricated using the method of FIG. 1 in one embodiment of the invention.

In step 102 shown in FIG. 2, a pit 202 (also commonly referred to as the "swimming pool") is formed in a topside of a device substrate 204. In one embodiment, device substrate 204 is silicon that is dry etched to form pit 202. In one embodiment, pit 202 has a depth about 4 to 6 microns.

Figure 3:
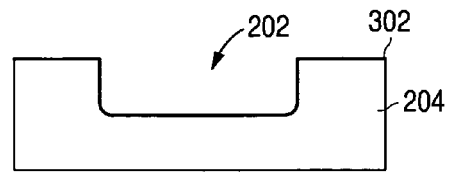

In step 104 shown in FIG. 3, an isolation layer 302 is formed over device substrate 204. Isolation layer 302 provides electrical isolation between conductive contacts to be formed on top of isolation layer 302. Isolation layer 302 also protects device substrate 204 from the phosphorus doping of the phosphosilicate glass (PSG) sacrificial material in pit 202 to be described later. In one embodiment, isolation layer 302 is silicon nitride($Si_3N_4$) deposited by low pressure chemical vapor deposition (LPCVD). Alternatively, isolation layer 302 is aluminum nitride (AlN) deposited by sputtering. In one embodiment, isolation layer 302 has a thickness of about 1500 angstroms (Å).

Figure 4:
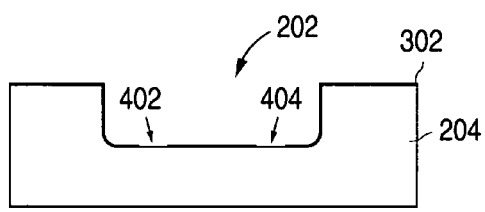

In step 106 shown in FIG. 4, isolation layer 302 is patterned to open contact windows 402 and 404. Contact windows 402 and 404 are opened where vias will be etched from the backside of device substrate 204 to pit 202. In one embodiment, contact windows 402 and 404 are opened by photolithography and etching. Note that step 106 is not necessary if the via etching is able to etch through isolation layer 302.

Figure 5:
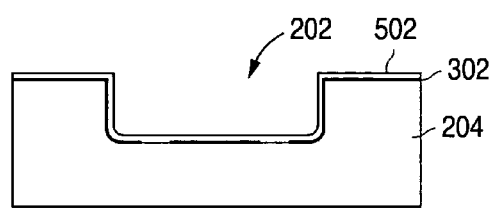

In step 108 shown in FIG. 5, a bottom contact metal 502 is formed over device substrate 204. Portions of bottom contact metal 502 extend down through contact windows 402 and 404 (FIG. 4). In one embodiment, bottom contact metal 502 is molybdenum deposited by sputtering. In one embodiment, bottom contact metal 502 has a thickness of about 5000 to 10,000 Å.

Figure 6:
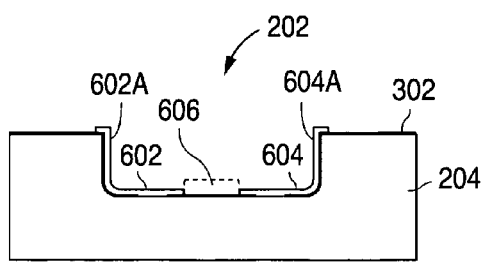

In step 110 shown in FIG. 6, bottom contact metal 502 (FIG. 5) is patterned to form a bottom electrode contact pad 602, a vertical trace 602A, a top electrode contact pad 604, and a vertical trace 604A. Contact pad 602 is located over contact window 402 and is connected to vertical trace 602A that travels up one sidewall of pit 202. Contact pad 604 is located over contact window 404 and is connected to vertical trace 604A that travels up another sidewall of pit 202. In one embodiment, contact pad 602, vertical trace 602A, contact pad 604, and vertical trace 604A are formed by photolithography and etching.

Bottom contact metal 502 may also be patterned to form passive elements such as resistors, capacitors, and interconnects. For example, FIG. 6 illustrates an exemplary passive element 606 shown in phantom.

Figure 7:
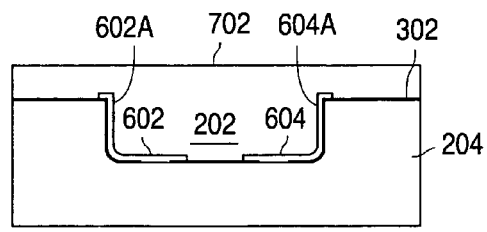

In step 112 shown in FIG. 7, a sacrificial material 702 is formed over device substrate 204 so that it fills pit 202. In one embodiment, sacrificial material 702 is PSG deposited by LPCVD.

Figure 8:
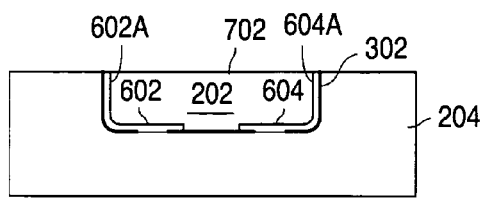

In step 114 shown in FIG. 8, sacrificial material 702 is planarized down to the topside of device substrate 204. In one embodiment, sacrificial material 702 is planarized by chemical mechanical polishing (CMP). This also removes any excess bottom contact metal 502 that extends beyond pit 202.

Figure 9:
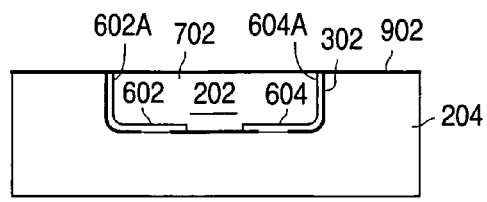

In step 116 shown in FIG. 9, an isolation layer 902 is formed over device substrate 204. Isolation layer 902 insulates the FBAR structure from device substrate 204. In one embodiment, isolation layer 902 is AlN deposited by sputtering.

Figure 10:
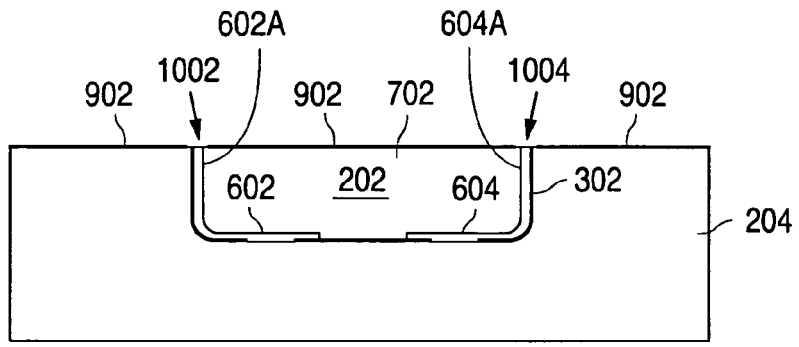

In step 118 shown in FIG. 10, isolation layer 902 is patterned to open contact windows 1002 and 1004 over vertical traces 602A and 604A, respectively. In one embodiment, contact windows 1002 and 1004 are formed by photolithography and etching.

Figure 11:
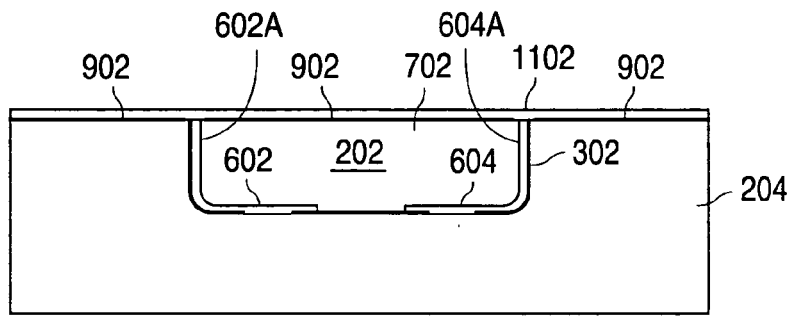

In step 120 shown in FIG. 11, a bottom electrode metal 1102 is formed over device substrate 204. Portions of bottom electrode metal 1102 extend down through contact windows 1002 and 1004 (FIG. 10) to connect with vertical traces 602A and 604A. In one embodiment, bottom electrode metal 1102 is molybdenum deposited by sputtering.

Figure 12:
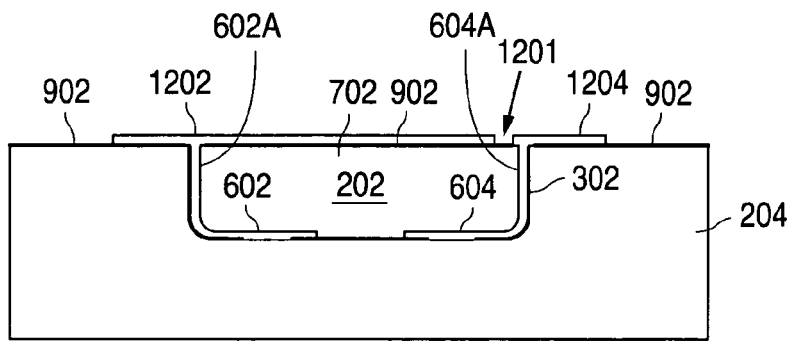

In step 122 shown in FIG. 12, bottom electrode metal 1102 is patterned to form an isolation trench 1201 that separates a bottom electrode 1202 and a top electrode contact pad 1204. Bottom electrode 1202 is connected by vertical trace 602A to contact pad 602 while contact pad 1204 is connected by vertical trace 604A to contact pad 604. In one embodiment, bottom electrode 1202 and contact pad 1204 are formed by photolithography and etching.

Figure 13:
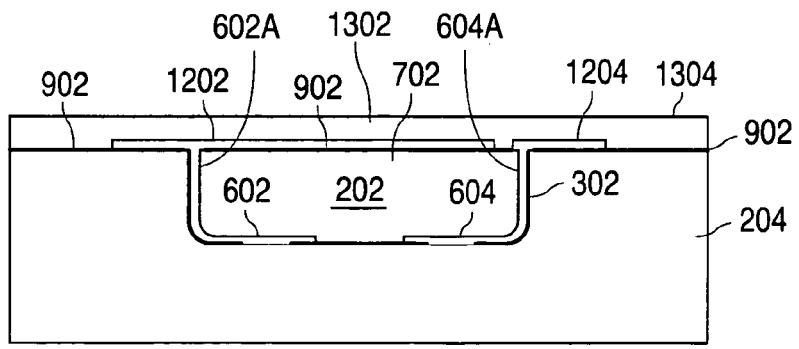

In step 124 shown in FIG. 13, a piezoelectric layer 1302 is formed over bottom electrode 1202, contact pad 1204, and device substrate 204. Step 124 in FIG. 1A is followed by step 126 in FIG. 1B, where a reference A indicates the transition of method 100 from FIG. 1A to FIG. 1B.

In step 126 that is also shown in FIG. 13, a cap layer 1304 is formed over piezoelectric layer 1302. Cap layer 1304 protects piezoelectric layer 1302 from contamination during the via etching of piezoelectric layer 1302 to be described later. In one embodiment, piezoelectric layer 1302 is AlN and cap layer 1304 is molybdenum both sequentially deposited by sputtering.

Figure 14:
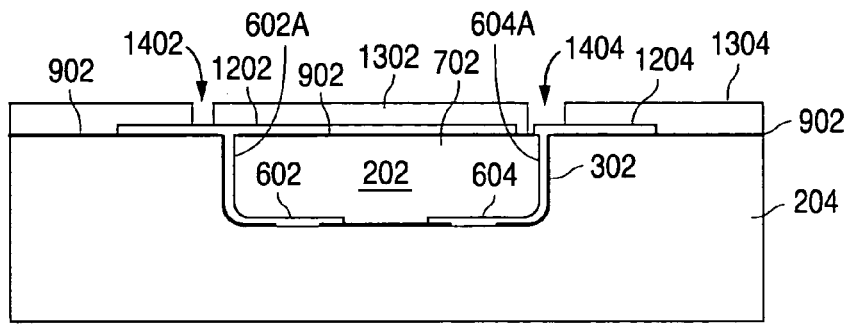

In step 128 shown in FIG. 14, cap layer 1304 and piezoelectric layer 1302 are patterned to form vias 1402 and 1404 down to bottom electrode 1202 and contact pad 1204, respectively. In one embodiment, vias 1402 and 1404 are formed by photolithography and etching.

Figure 15:
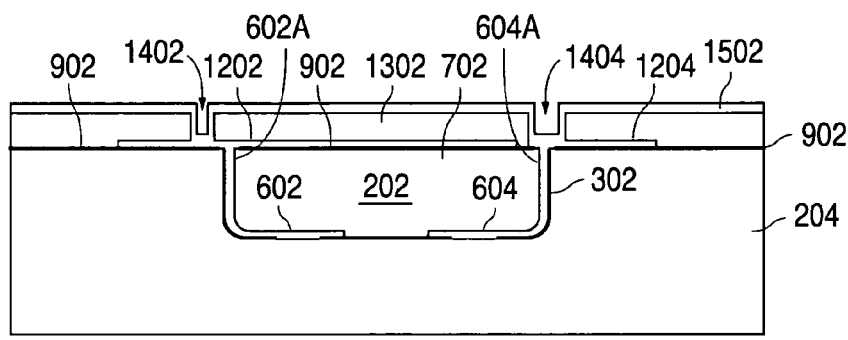

In step 130 shown in FIG. 15, a top electrode metal 1502 is formed on seed can layer 1304 over piezoelectric layer 1302. As can be seen, top electrode metal 1502 extends down vias 1402 and 1404 to connect with bottom electrode 1202 and contact pad 1204, respectively. In one embodiment, top electrode metal 1502 is molybdenum deposited by sputtering. Note that cap layer 1304 (FIG. 14) is not illustrated separately from top electrode metal 1502.

Figure 16:
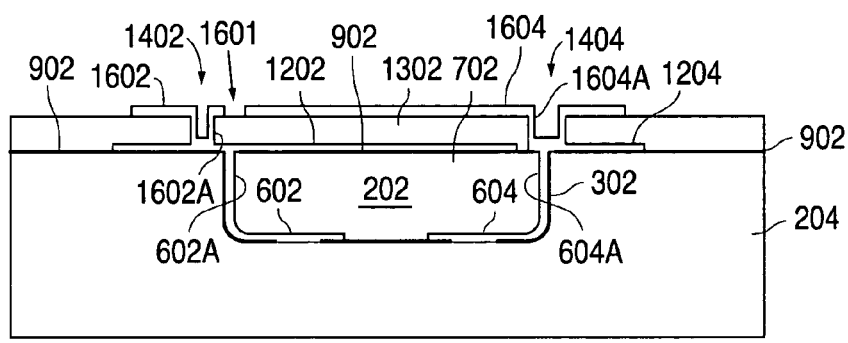

In step 132 shown in FIG. 16, top electrode metal 1502 (FIG. 15) is patterned to form an isolation trench 1601 that separates a bottom electrode contact pad 1602 and a top electrode 1604. Contact pad 1602 has a portion that forms a via contact 1602A down via 1402 to connect to bottom electrode 1202. Similarly, top electrode 1604 has a portion that forms a via contact 1604A down via 1404 to connect to contact pad 1204. In one embodiment, contact pad 1602 and top electrode 1604 are patterned by photolithography and etching. At this point, the FBAR structure is complete with bottom electrode 1202, a piezoelectric layer 1302 on top of bottom electrode 1202, and top electrode 1604 on top of piezoelectric layer 1302.

Figure 17:
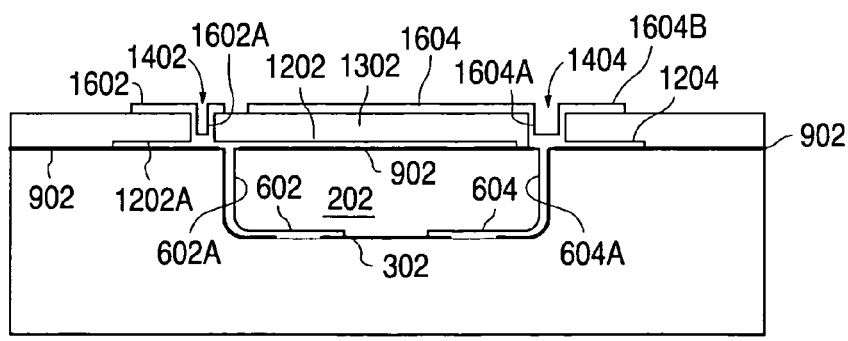

In step 134 shown in FIG. 17, sacrificial material 202 (FIG. 16) in pit 202 is removed and the FBAR structure is released so that it is suspended over pit 202. In one embodiment, sacrificial material 202 is removed by a wet etch through one or more small perforations (not shown) in the FBAR structure.

Contact pad 1602 can be extended laterally to couple to the bottom or the top electrode of an adjacent FBAR structure, and a tab portion 1604B of top electrode 1604 can be extended laterally to couple to the top or the bottom electrode of the adjacent FBAR structure. Similarly, contact pad 1204 can be extended laterally to couple to the top or the bottom electrode of the adjacent FBAR structure, and a tab portion 1202A of bottom electrode 1202 can be extended laterally to couple to the bottom or the top electrode of the adjacent FBAR structure. In addition, contact pad 1602 and tab 1604B of top electrode 1604 can be coupled to passive elements in an optional cap to be mounted on device substrate 204.

Figure 18:
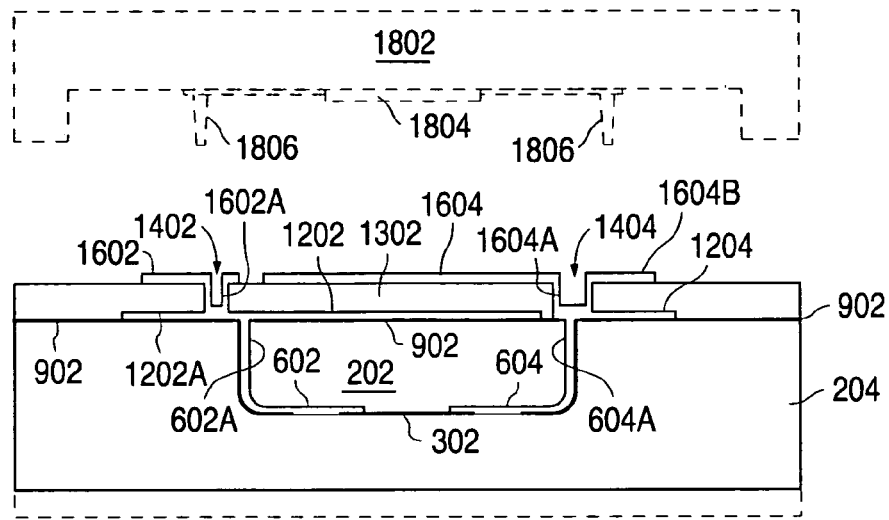

In step 136 shown in FIG. 18, an optional cap 1802 is bonded to device substrate 204 to protect the FBAR structure and the backside of device substrate 204 is ground to reduce its thickness. As described above, cap 1802 may have a passive element 1804 coupled by contact posts 1806 to contact pad 1602 and tab 1604B of top electrode 1604.

Figure 19:
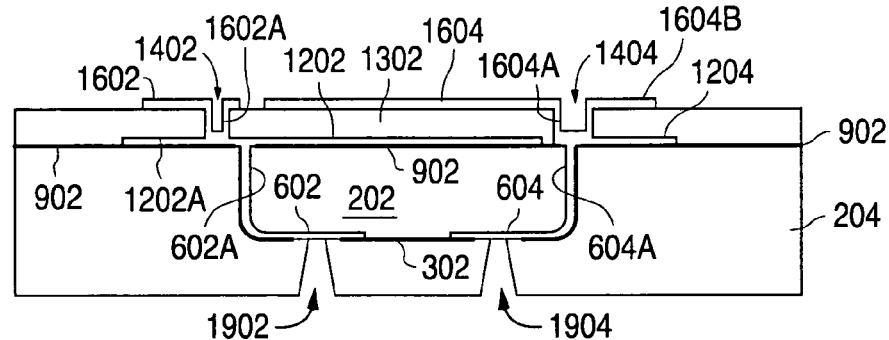

In step 138 shown in FIG. 19, the backside of device substrate 204 is patterned to form vias 1902 and 1904 up to contact pads 602 and 604, respectively. In one embodiment, vias 1902 and 1904 are formed by photolithography and etching.

Figure 20:
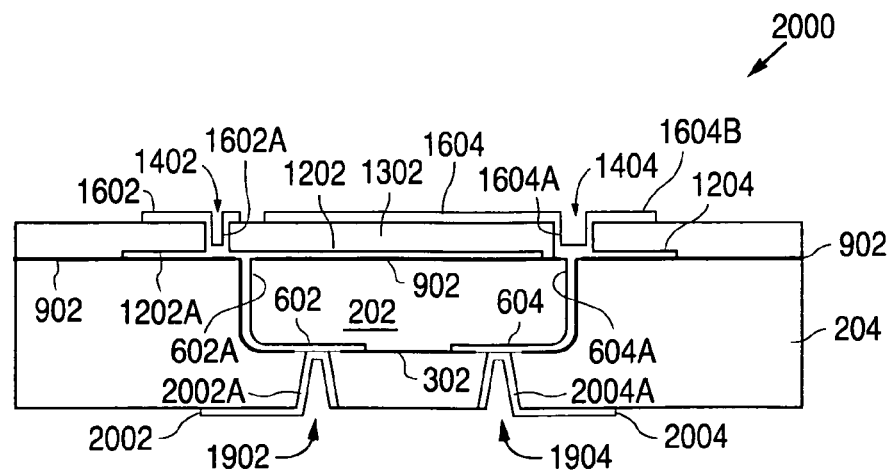

In step 140 shown in FIG. 20, a contact metal is formed over the backside of device substrate 204 and patterned to form a bottom electrode contact pad 2002, via contact 2002A, a top electrode contact pad 2004, and a via contact 2004A. Specifically, contact pad 2002 is connected by via contact 2002A up to contact pad 602. Similarly, contact pad 2004 is connected by via contact 2004A to contact pad 604. In one embodiment, contact pad 2002, contact via 2002A, contact pad 2004, and contact via 2004A are gold electroplated onto the backside of device substrate 204 and into vias 1902 and 1904, and then patterned by photolithography and etching.

In device 2000, contact pads 2002 and 2004 to the FBAR structure is located under pit 202 so they do not occupy any additional areas. Electrical interconnects can now be routed under pit 202 to provide shorter paths and more connection options. Furthermore, passive elements may be formed in pit 202 and connected to various FBAR structures. Contact pads 2002 and 2004 also offers an alternative to the via structures and via pads in the cap wafer described in U.S. Pat. No. 6,777,263. It can further be seen that pit 202 may consist of a single electrode connecting to either the bottom electrode or to the top electrode. Lastly, if bumping is used on the bottom of device substrate 204, contact pads 2002 and 2004 may improve heat dissipation by providing a thermal path from the FBAR to solder bumps and the printed circuit board.

Various other adaptations and combinations of features of the embodiments disclosed are within the scope of the invention. Numerous embodiments are encompassed by the following claims.

What is claimed is:

1. A device, comprising:
   a device substrate, defining:
      a pit in a topside of the device substrate; and
      a first via from a backside of the device substrate up to the pit;
   a firm bulk-wave acoustic resonator (FBAR) mounted over and spanned across the pit in the topside of the device substrate, the FBAR comprising a piezoelectric layer sandwiched between a top electrode and a bottom electrode, the first via being located under the FBAR; and
   a first via contact in the first via, the first via contact being coupled to one of the bottom electrode and the top electrode.

2. The device of claim 1, wherein the first via contact is coupled to the bottom electrode.

3. The device of claim 2, wherein the device substrate further defines a second via from the backside of the device substrate up to the pit, the device further comprising:
a second via contact in the second via, the second via contact being coupled to the top electrode; and
first and second contact pads on the backside of the device substrate, the first and the second contact pads being coupled to the first and the second via contacts, respectively.

4. The device of claim 3, further comprising:
a third contact pad in the pit over the first via, the third contact being coupled to the first via contact;
a first vertical trace up the pit, the first vertical trace being coupled to the third contact pad;
a fourth contact pad in the pit over the second via, the fourth contact being coupled to the second via contact; and
a second vertical trace up the pit, the second vertical trace being coupled to the fourth contact pad.

5. The device of claim 4, further comprising a passive element in the pit.

6. The device of claim 4, wherein the bottom electrode is located over and coupled to the first vertical trace, the device further comprising:
a fifth contact pad on the topside of the device substrate over the second vertical trace, the fifth contact being coupled to the second vertical trace.

7. A device, comprising:
a device substrate, defining:
a pit in a topside of the device substrate; and
first and second vias from a backside of the device substrate up to the pit;
a film bulk-wave acoustic resonator (FBAR) mounted over the pit in the topside of the device substrate, the FBAR comprising a piezoelectric layer sandwiched between a top electrode and a bottom electrode, the piezoelectric layer defining third and fourth vias;
first and second contact pads on the backside of the device substrate;
a first via contact in the first via, the first via contact being coupled to the first contact pad; and
a second via contact in the second via, the second via contact being coupled to the second contact pad;
a third contact pad in the pit over the first via, the third contact being coupled to the first via contact;
a first vertical trace that travels up the pit to the bottom electrode, the first vertical trace being coupled to the third contact pad and the bottom electrode, wherein the bottom electrode is thus coupled to the first contact pad on the backside of the device substrate;
a fourth contact pad in the pit over the second via, the fourth contact being coupled to the second via contact;
a fifth contact pad on the topside of the device substrate over a second vertical trace;
the second vertical trace that travels up the pit to the fifth contact pad, the second vertical trace being coupled to the fourth contact pad and the fifth contact pad;
a sixth contact pad on the piezoelectric layer;
a third via contact in the third via, the third via contact being coupled to the bottom electrode and the sixth contact pad; and
a fourth via contact in the fourth via, the fourth via contact being coupled to the fifth contact pad and the top electrode, wherein the top electrode is thus coupled to the second contact pad on the backside of the device substrate.

8. The device of claim 7, wherein at least one of a portion of the bottom electrode and the fifth contact pad is coupled to another FBAR.

9. The device of claim 7, wherein at least one of the sixth contact pad and a portion of the top electrode is coupled to another FBAR.

10. The device of claim 7, further comprising:
a cap mounted on the device substrate; and
a passive element on the cap coupled to at least one of the sixth contact pad and a portion of the top electrode.

11. A method for forming a device, comprising:
forming a pit in a topside of a device substrate;
forming a film bulk-wave acoustic resonator (FBAR) over and across the pit in the topside of the device substrate, the FBAR comprising a piezoelectric layer sandwiched between a top electrode and a bottom electrode;
forming a first via from a backside of the device substrate up to the pit, the first via being located under the FBAR; and
forming a first via contact in the first via, the first via contact being coupled to one of the top electrode and the bottom electrode.

12. The method of claim 11, wherein the first via contact is coupled to the bottom electrode.

13. The method of claim 12, further comprising:
forming a second via from the backside of the device substrate up to the pit; and
forming a second via contact in the second via, the second via contact being coupled to the top electrode;
forming first and second contact pads on the backside of the device substrate, the first and the second contact pads being coupled to the first and the second via contacts, respectively.

14. The method of claim 13, further comprising:
forming a third contact pad in the pit over the first via, the third contact pad being coupled to the first via contact;
forming a first vertical trace up the pit, the first vertical trace being coupled to the third contact pad;
forming a fourth contact pad in the pit over the second via, the fourth contact pad being coupled to the second via contact; and
forming a second vertical trace up the pit, the second vertical trace being coupled to the fourth contact pad.

15. The method of claim 13, further comprising:
forming a passive element in the pit.

16. The method of claim 13, further comprising:
forming the bottom electrode over the pit and over the first vertical trace, wherein the bottom electrode is coupled to the first vertical trace; and
forming a fifth contact pad on the topside of the device substrate and over the second vertical trace, wherein the fifth contact pad is coupled to the second vertical trace.

17. A method for forming a device, comprising:
forming a pit in a topside of a device substrate;
forming a film bulk-wave acoustic resonator (FBAR) over the pit in the topside of the device substrate, the FBAR comprising a piezoelectric layer sandwiched between a top electrode and a bottom electrode;
forming first and second contact pads on a backside of the device substrate;
forming a third contact pad in the pit;
forming a first vertical trace up the pit to the bottom electrode, the first vertical trace being coupled to the third contact pad and the bottom electrode;

forming a fourth contact pad in the pit;
forming a second vertical trace up the pit, the second vertical trace being coupled to the fourth contact pad;
forming first and second vias from the backside of the device substrate to the third and the fourth contact pads, respectively;
forming a first via contact in the first via, the first via contact being coupled to the first and the third contact pads;
forming a second via contact in the second via, the second via contact being coupled to the second and the fourth contact pads;
forming a fifth contact pad on the topside of the device substrate and over the second vertical trace, the fifth contact pad being coupled to the second vertical trace;
forming a third via in the piezoelectric layer down to the bottom electrode;
forming a fourth via in the piezoelectric layer down to the fifth contact pad;
forming a sixth contact pad over the piezoelectric layer;
forming a third via contact in the third via, the third via contact being coupled to the sixth contact pad and the bottom electrode; and
forming a fourth via contact in the fourth via, the fourth via contact being coupled to the top electrode and the fifth contact pad.

18. The method of claim 17, further comprising:
coupling at least one of a portion of the bottom electrode and the fifth contact pad to another FBAR.

19. The method of claim 17, further comprising:
coupling at least one of the sixth contact pad and a portion of the top electrode to another FBAR.

20. The method of claim 17, further comprising:
mounting a cap on the device substrate, wherein the cap includes a passive element coupled to at least one of the sixth contact pad and a portion of the top electrode.

* * * * *